(12) United States Patent
Kito

(10) Patent No.: US 12,304,746 B2
(45) Date of Patent: May 20, 2025

(54) FEEDER OPERATION INSPECTION DEVICE

(71) Applicant: FUJI CORPORATION, Chiryu (JP)

(72) Inventor: Shuichiro Kito, Toyota (JP)

(73) Assignee: FUJI CORPORATION, Chiryu (JP)

( * ) Notice: Subject to any disclaimer, the term of this patent is extended or adjusted under 35 U.S.C. 154(b) by 741 days.

(21) Appl. No.: 17/640,266

(22) PCT Filed: Sep. 6, 2019

(86) PCT No.: PCT/JP2019/035110
§ 371 (c)(1),
(2) Date: Mar. 3, 2022

(87) PCT Pub. No.: WO2021/044607
PCT Pub. Date: Mar. 11, 2021

(65) Prior Publication Data
US 2022/0332514 A1 Oct. 20, 2022

(51) Int. Cl.
*B65G 43/10* (2006.01)
*G06T 7/246* (2017.01)
*G06T 7/73* (2017.01)

(52) U.S. Cl.
CPC .............. *B65G 43/10* (2013.01); *G06T 7/246* (2017.01); *G06T 7/73* (2017.01); *B65G 2203/041* (2013.01)

(58) Field of Classification Search
CPC .. B65G 43/10; B65G 2203/041; G06T 7/246; G06T 7/73
See application file for complete search history.

(56) References Cited

U.S. PATENT DOCUMENTS

| | | | |
|---|---|---|---|
| 11,304,348 B2 * | 4/2022 | Matsushita | .......... H05K 13/086 |
| 2003/0072644 A1 * | 4/2003 | Yamamura | ......... H05K 13/0419 414/749.1 |
| 2010/0181361 A1 * | 7/2010 | Tsukagoshi | ........ H05K 13/0419 226/76 |

(Continued)

FOREIGN PATENT DOCUMENTS

| | | |
|---|---|---|
| DE | 11 2011 104 458 T5 | 9/2013 |
| JP | 2010-186811 A | 8/2010 |

(Continued)

OTHER PUBLICATIONS

International Search Report mailed on Dec. 3, 2019 in PCT/JP2019/035110 filed on Sep. 6, 2019 (2 pages).

*Primary Examiner* — Kyle O Logan
(74) *Attorney, Agent, or Firm* — Oblon, McClelland, Maier & Neustadt, L.L.P.

(57) ABSTRACT

A feeder operation inspection device includes an image processing section configured to deduce a position of a brightness change point group, which is a set of brightness change points where an amount of change in brightness relative to a periphery in an image datum is equal to or larger than a specified value, for each of multiple image data, a calculating section configured to calculate an actual conveyance amount of a carrier tape which is actually conveyed through a conveyance process based on the position of the brightness change point group of each of the multiple image data, and a determination section configured to determine whether the feeder operates normally in the conveyance process based on a designated conveyance amount and an actual conveyance amount in the conveyance process.

9 Claims, 6 Drawing Sheets

(56) References Cited

U.S. PATENT DOCUMENTS

| | | | |
|---|---|---|---|
| 2015/0147143 A1* | 5/2015 | Shimizu | H05K 13/0419 |
| | | | 414/226.04 |
| 2016/0249499 A1* | 8/2016 | Sumi | H05K 13/0417 |
| 2016/0366797 A1* | 12/2016 | Sumi | H05K 13/0812 |
| 2017/0354070 A1* | 12/2017 | Kobayashi | H05K 13/086 |
| 2018/0249608 A1 | 8/2018 | Komiyama et al. | |
| 2019/0307032 A1* | 10/2019 | Eguchi | H05K 13/02 |
| 2019/0313557 A1* | 10/2019 | Matsushita | H05K 13/082 |
| 2020/0323114 A1* | 10/2020 | Matsushita | H05K 13/0419 |

FOREIGN PATENT DOCUMENTS

| | | |
|---|---|---|
| JP | 2016-63044 A | 4/2016 |
| JP | 2016-157754 A | 9/2016 |
| JP | 2017-117922 A | 6/2017 |
| WO | WO 2017/033284 A1 | 3/2017 |

\* cited by examiner

FEEDER OPERATION INSPECTION DEVICE

TECHNICAL FIELD

The present disclosure relates to a feeder operation inspection device.

BACKGROUND ART

A feeder operation inspection device is used to inspect the operation of a feeder. As illustrated in Patent Literature 1, a feeder is set in a component mounter for use in supplying a component. The feeder is loaded with a carrier tape which accommodates components and conveys this carrier tape to thereby supply the components so as to be picked up. Whether the carrier tape is installed normally in the feeder is confirmed visually by, for example, an operator.

PATENT LITERATURE

Patent Literature 1: JP-A-2017-117922

BRIEF SUMMARY

Technical Problem

Here, in the event that the carrier tape fails to be installed normally, there is a possibility that the feeder is caused to operate abnormally or malfunctions. Since there is a possibility that the production efficiency of the component mounter is badly affected when the feeder operates abnormally, such an abnormal operation of the feeder is desirably detected as early as possible. In addition, the abnormal operation of the feeder is sometimes attributed to a failure of a drive system or a control system which is different from the installation failure of the carrier tape. In such a case, it is not easy for the operator to detect an abnormal operation of the feeder.

The present description has been made in view of the situations described above, and an object thereof is to provide an operation inspection device for detecting an abnormal operation of a feeder which is loaded with a carrier tape.

Solution to Problem

According to the present description, there is provided a feeder operation inspection device for a feeder for conveying a carrier tape, the feeder executing a conveyance process for conveying the carrier tape by a designated conveyance amount, the feeder operation inspection device including a storage device configured to store multiple image data obtained by causing the carrier tape to be imaged by a camera at multiple different timings during execution of the conveyance process, an image processing section configured to deduce a position of a brightness change point group, which is a set of brightness change points in which an amount of change in brightness relative to a periphery in the image data is equal to or larger than a specified value, for each of the multiple image data, a calculating section configured to calculate an actual conveyance amount of the carrier tape which is actually conveyed through the conveyance process based on the position of the brightness change point group of each of the multiple image data, and a determination section configured to determine whether the feeder operates normally in the conveyance process based on the designated conveyance amount and the actual conveyance amount in the conveyance process.

Advantageous Effects

With such a configuration, an abnormal operation of the feeder, which is loaded with the carrier tape, can be detected. In addition, the feeder operation inspection device extracts a brightness change point group and deduces a position of the brightness change point group in the image processing. As a result, for example, even if a feeding hole, which corresponds to the brightness change point group, is deformed or the apparent shape of the feeding hole is changed as a result of a change in the type of the carrier tape or imaging environment, the feeding hole can be recognized as a brightness change point group, whereby an actual conveyance amount of the carrier tape can be calculated.

DESCRIPTION OF EMBODIMENTS

1. Overview of Feeder Operation Inspection Device

Figure 1:
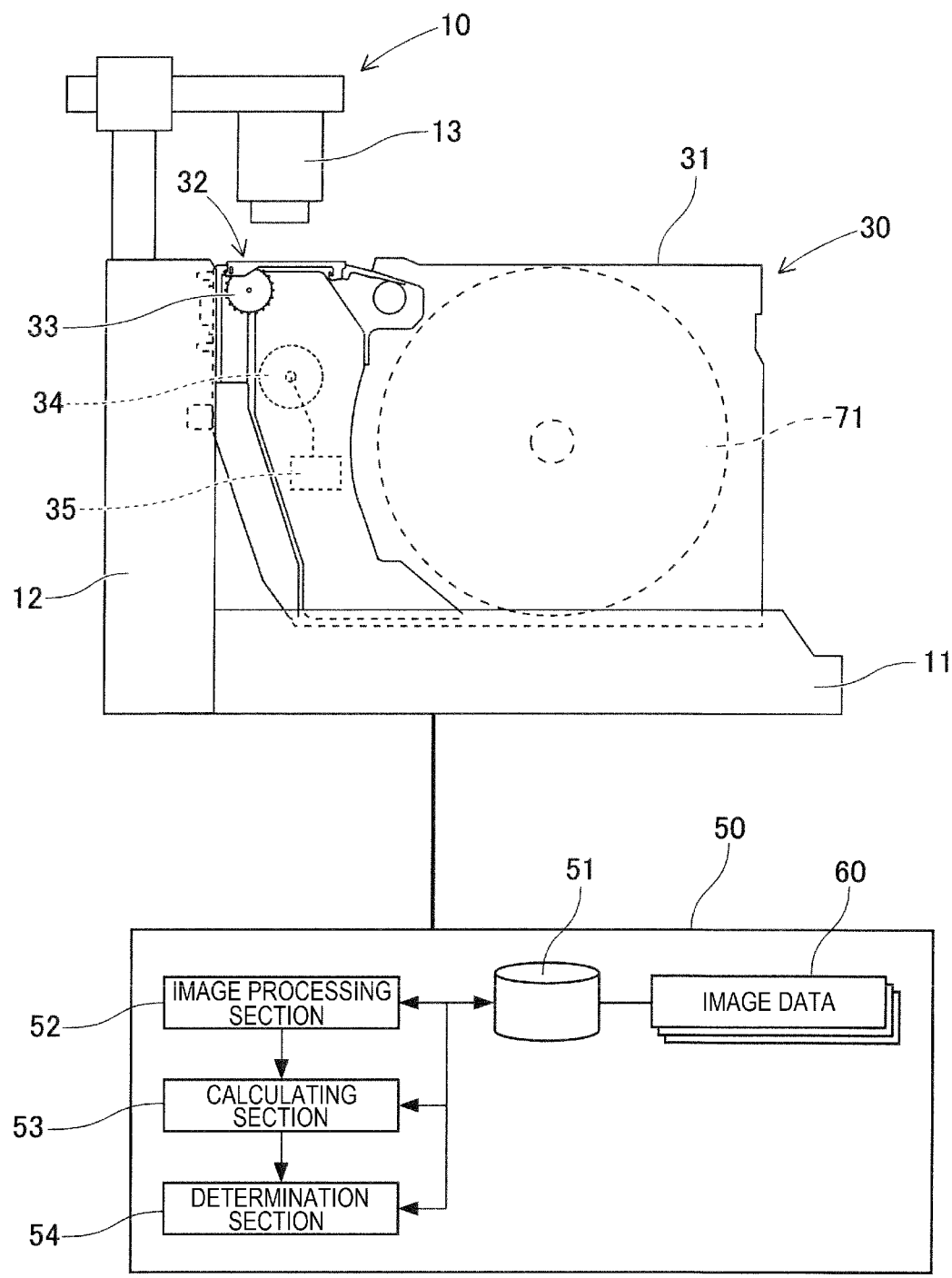
FIG. 1 is a schematic diagram showing the configurations of a tape installation device and an operation inspection device according to an embodiment.

Hereinafter, referring to drawings, an embodiment embodying a feeder operation inspection device will be described. In the present embodiment, operation inspection device 50 for feeder 30 will be described as being applied to tape installation device 10 as shown in FIG. 1. Feeder 30 is set in component mounter 20 for use for supplying a component (refer to FIG. 7).

2. Configuration of Tape Installation Device 10

Tape installation device 10 assists in installing or automatically installs carrier tape 80 in feeder 30. In the present embodiment, tape installation device 10 assists an operator to install carrier tape 80 in feeder 30. As shown in FIG. 1, tape installation device 10 holds feeder 30 by feeder holding section 12 provided on base 11. Feeder 30, which is held by tape installation device 10, is supplied with electric power and is then allowed to communicate with operation inspection device 50, which will be described later.

Tape installation device 10 includes an exclusive camera 13. Camera 13 is a digital imaging device having an imaging element such as CMOS. Camera 13 captures images which fall within camera's visual field Fc1 (refer to FIG. 3) based on a control signal which is connected for communication therewith. Camera 13 transmits image data which camera 13 obtains through imaging. Camera 13 is provided in such a manner that its optical axis follows a vertical direction and is configured to image carrier tape 80 from above feeder 30 which is held by feeder holding section 12. Specifically speaking, camera 13 is configured to image at least part of tape guide 40 of feeder 30.

3. Configurations of Feeder 30 and Carrier Tape 80

Feeder 30 includes main body section 31. Main body section 31 is formed into a flat box shape. Main body section 31 includes supply section 32 for supplying a component to component mounter 20. Supply section 32 is formed at a front upper portion of main body section 31. In addition, main body section 31 holds reel 71, around which carrier tape 80 is wound, detachably (in an exchangeable fashion). Reel 71 is supported rotatably with respect to main body section 31.

Figure 2:
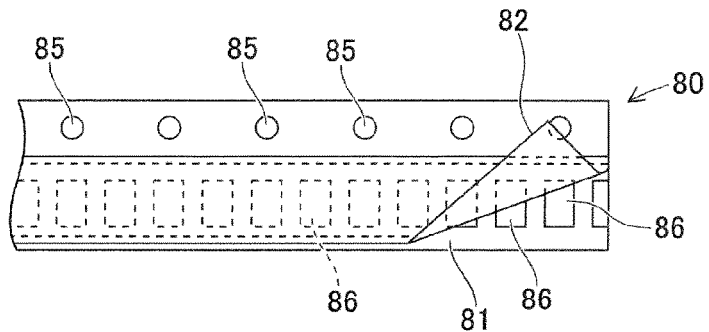
FIG. 2 is a top view showing a part of a carrier tape.

Here, carrier tape 80 is made up of base tape 81 and cover tape 82 as shown in FIG. 2. Base tape 81 has multiple feeding holes 85 and multiple component accommodating cavities 86, which are both formed at equal intervals in a conveyance direction (a longitudinal direction of the carrier tape). Feeding holes 85 and cavities 86, which are described above, can constitute apparent characteristic sections of carrier tape 80. Cover tape 82 is bonded to an upper surface of base tape 81 so as to close opening portions of cavities 86. Hereinafter, the carrier tape will also be referred to, simply, as a "tape".

As shown in FIG. 1, feeder 30 includes sprocket 33, which is rotatably supported on main body section 31. Sprocket 33 has engagement projections which are disposed thereon at equal intervals in a circumferential direction in such a manner as to be brought into engagement with feeding holes 85 of tape 80. Feeder 30 has motor 34, which functions as a driving source for rotating sprocket 33. For motor 34, for example, a stepping motor is adopted which is configured to rotate sprocket 33 by a predetermined amount in accordance with a pulse power supplied.

Feeder 30 has feeder control section 35 for controlling the operation of motor 34. Feeder control section 35 executes a conveyance processing for conveying tape 80 by a designated conveyance amount Ns. In the conveyance processing, feeder control section 35 causes motor 34 to rotate sprocket 33 by supplying electric power to motor 34 to thereby convey tape 80 to a predetermined position.

When feeder 30 is set in an external device such as tape installation device 10 or component mounter 20, feeder 30 is supplied with electric power from the external device via a connector. As a result, feeder control section 35 is allowed to communicate with the external device. Feeder control section 35 controls the operation of motor 34 and a rotation amount of sprocket 33 based on a control command or the like given by the external device. In addition, feeder control section 35 transmits a feeder ID inherent to feeder 30 to the external device in response to a request from the external device.

Figure 3:
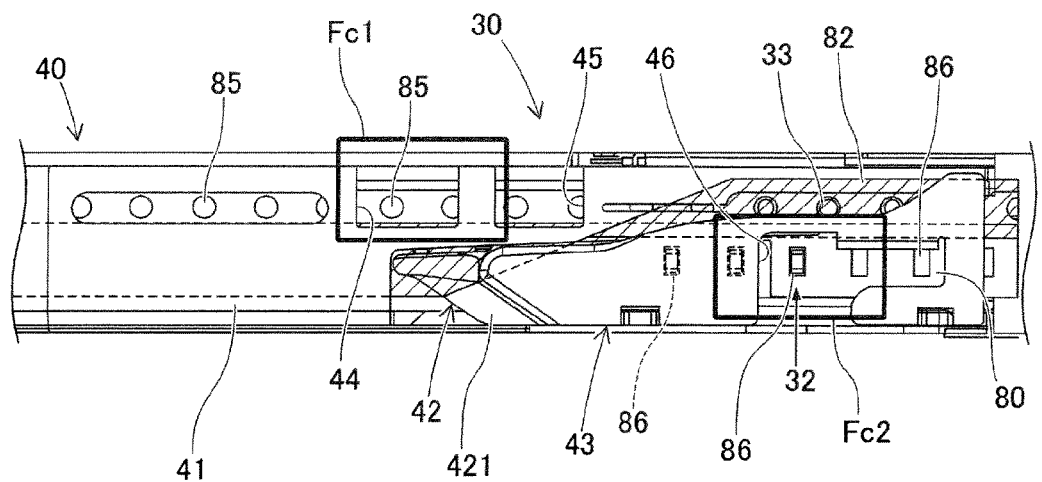
FIG. 3 is a top view showing a periphery of a supply section in FIG. 1 in an enlarged fashion.

Feeder 30 includes tape guide 40. Tape guide 40 is detachably attached to an upper portion of feeder 30 in the vicinity of supply section 32. Tape guide 40 restrains tape 80 from moving upwards and in a widthwise direction to guide tape 80 for engagement with sprocket 33. As shown in FIGS. 1 and 3, tape guide 40 includes guide main body 41, peeling device 42, and folding device 43.

Guide main body 41 is formed into a U-shape in section as an overall shape and is opened at a bottom thereof. Multiple opening sections 44, 45 are formed in an upper wall of guide main body 41 within a range positioned above feeding holes 85 of tape 80 being conveyed. As a result, the operator can see to know whether tape 80 is being conveyed underneath tape guide 40. Cutout portion 46 is formed in the upper wall of guide main body 41 in a range including supply section 32. As a result, tape guide 40 enables a component to be picked up from cavity 86 of tape 80 which is positioned at supply section 32.

Peeling device 42 is provided on guide main body 41. Peeling device 42 has peeling blade 421 that cuts into an adhesive portion between base tape 81 and cover tape 82. Peeling blade 421 peels off a part of cover tape 82 from base tape 81 as tape 80 is conveyed. Cover tape 82 is left adhering to base tape 81 along a longitudinal edge portion thereof on a side which lies to face feeding holes 85 in base tape 81.

Folding device 43 is provided on guide main body 41 and is positioned closer to supply section 32 than a tip of peeling blade 421 of peeling device 42. Folding device 43 lifts up a part of cover tape 82, which is peeled off by peeling device 42 from base tape 81 while being partly left adhering thereto, and folds the part of cover tape 82 so lifted up towards feeding holes 85. As a result, a state results in which an opening portion of cavity 86 on base tape 81 is not closed by cover tape 82. To describe this in details, as shown in FIG. 3, folding device 43 lifts up and folds cover tape 82 (a visible part of cover tape 82 is shown as hatched in FIG. 3) which is peeled off from base tape 81.

According to the configuration described above, tape guide 40 holds tape 80 between main body section 31 and guide main body 41 as tape 80 is conveyed towards supply section 32. Further, as tape 80 is conveyed, tape guide 40 folds tape 80 while peeling off cover tape 82 from base tape 81 and exposes a component accommodated in cavity 86 for pickup in supply section 32. A part of tape 80 which has passed supply section 32 is discharged from a tape discharge section (not shown) formed in a front portion of main body section 31 to the outside of feeder 30.

Feeder 30, which is configured as described above, is set in tape installation device 10 for exchange of reel 71. At this time, a barcode affixed to reel 71 is read by a code reader (not shown) of tape installation device 10, and a component ID that the barcode shows is stored in association with a feeder ID of feeder 30. Further, feeding holes 85 of tape 80 are brought into engagement with sprocket 33 in such a manner that tape 80 can be conveyed, whereby tape 80 is installed in feeder 30.

Feeder 30, which is loaded with tape 80, is set in component mounter 20. Feeder 30 executes a conveyance process for conveying tape 80 when component mounter 20 executes a mounting process for mounting a component on board 90. In the conveyance process, feeder 30 conveys tape 80 by a designated conveyance amount Ns in such a manner that multiple cavities 86 on tape 80 are sequentially positioned in supply section 32. Here, the designated conveyance amount Ns corresponds to an interval defined between adjacent cavities 86. In an operation inspection of feeder 30 by operation inspection device 50, which will be described later, the designated conveyance amount Ns is set to an amount shorter than an interval defined between adjacent feeding holes 85.

4. Configuration of Operation Inspection Device 50

Feeder 30 is loaded with tape 80 in advance as a setup for a mounting process by component mounter 20. Then, when an installation process of tape 80 in feeder 30 is not executed appropriately, this is referred to as an installation failure. A case is assumed as a cause for the installation failure in which engagement projections of sprocket 33 are not in engagement with feeding holes 85 of tape 80, for example. As described above, an occurrence of the installation failure of tape 80 can cause feeder 30 to operate abnormally.

In addition, the abnormal operation of feeder 30 may be attributed to a failure of a drive system or a control system of feeder 30 in addition to the installation failure of tape 80. Specifically speaking, it is assumed that a shortage or excess of a rotation amount of sprocket 33 which does not reach or exceeds a permissible range is generated irrespective of the fact that motor 34 is fed. This is attributed to the fact that feeder 30 is not maintained sufficiently or setting of a calibration value for a feeding amount of motor 34 fails when rotating sprocket 33, or the like.

Here, for example, the operator visually verifies whether tape 80 is normally installed in feeder 30. However, depending on various causes such as the state of engagement of sprocket 33 with feeding holes 85 of feeder 30, an abnormal operation of feeder 30 fails to be noticed at the time of a setup change. Since an abnormal operation of feeder 30 possibly affects the production efficiency at component mounter 20, the abnormal operation of feeder 30 is desirably detected as early as possible.

Then, operation inspection device 50 inspects the operation of feeder 30, which is now loaded with tape 80. In the present embodiment, operation inspection device 50 is incorporated in tape installation device 10 to execute an operation inspection on feeder 30, in which reels 71 are exchanged and tape 80 is installed, as an inspection target object at the time of a setup change. Specifically speaking, operation inspection device 50 causes feeder 30 to perform a predetermined operation and camera 13 to image an operation state of feeder 30, and determines whether feeder 30 operates normally through image processing.

Operation inspection device 50 is made up mainly of CPU, various types of memories, and a control circuit. Operation inspection device 50 can obtain a feeder ID for specifying feeder 30 and correction information for use for a conveyance operation of tape 80 by communication with feeder 30. In addition, operation inspection device 50 can obtain a component ID associated with a feeder ID which is managed by a host computer connected therewith for communication.

As shown in FIG. 1, operation inspection device 50 includes storage device 51. Storage device 51 is made up of an optical drive device such as a hard disk device or a flash memory, and the like. Storage device 51 stores multiple image data 60 captured through imaging by camera 13. Here, in the present embodiment, camera visual field Fc1 of camera 13 is set in the vicinity of opening section 44 of tape guide 40, as shown in FIG. 3. Thus, image data 60 obtained through imaging by camera 13 includes opening section 44 and feeding holes 85 of tape 80, as shown in FIGS. 4a and 4b.

In addition to those stored as described above, storage device 51 can store times when camera 13 performs imaging and driving states of feeder 30 when an imaging process is performed by camera 13 in association with multiple individual image data 60. The driving states of feeder 30 include an initial state when the conveyance process of tape 80 is initiated, an intermediate state when sprocket 33 rotates by a predetermined amount, a termination state when the conveyance process is terminated, and the like. When feeder 30 is loaded properly with tape 80 and no failure is found in the drive system or the control system, tape 80 is conveyed by the designated conveyance amount Ns. The designated conveyance amount Ns may include an allowable error that is set in advance.

Operation inspection device 50 includes image processing section 52, as shown in FIG. 1. As shown in FIGS. 4a and 4b, image processing section 52 deduces brightness change point group 65 for each of multiple image data 60. The "brightness change point group" is a set of brightness change points 61 at which an amount of change in brightness relative to a periphery is equal to or larger than a specified value in image data 60. Each of multiple brightness change points 61 corresponds to, for example, a boundary between adjacent areas which differ from each other in lightness or hue (that is, brightness) over a predetermined threshold value in image data 60, for example. Brightness change point 61 may take a pixel of an imaging element as a minimum unit (a single point) or may take a certain number of pixels or a range corresponding thereto as a minimum unit.

Figure 4A:
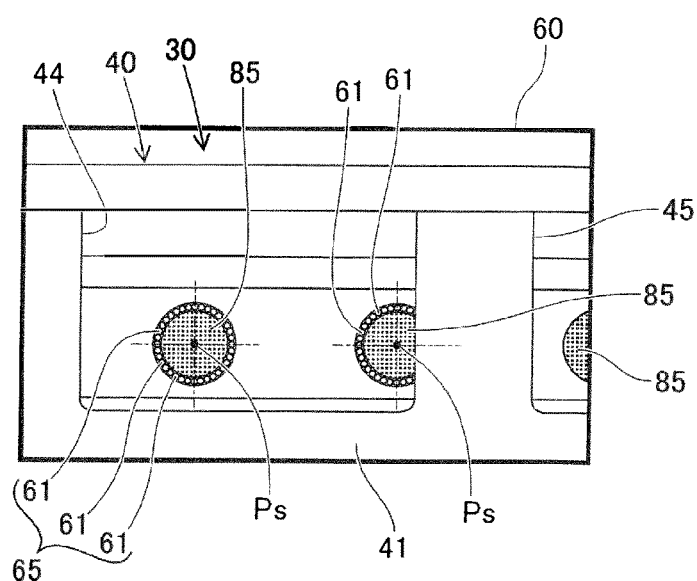
FIG. 4a is a diagram showing an example of a state in which an image processing is executed on an image datum obtained by imaging by a camera.
Figure 4B:
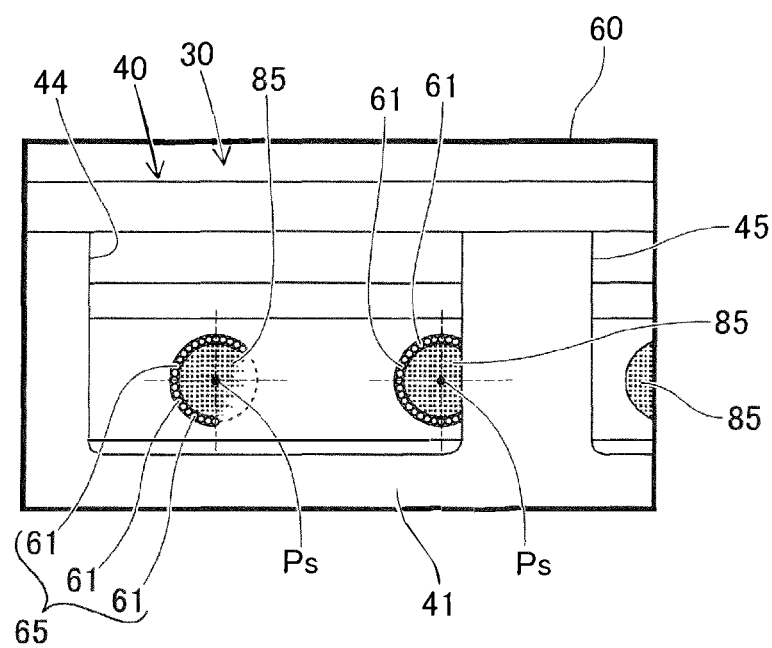
FIG. 4b is a diagram showing an example of a state in which an image processing is executed on an image datum obtained by imaging by the camera.

Brightness change point group 65 is a set of brightness change points 61 in which those brightness change points 61 continue, and as shown in FIG. 4a, brightness change point group 65 can form a closed figure of, for example, a circular shape. In addition, depending on the relationship among camera 13, a light source, whose illustration is omitted, and tape 80, brightness change point group 65 in image data 60 can form an open figure of, for example, an arc-like shape as shown in FIG. 4b.

In the present embodiment, brightness change point group 65 may be an occupied area of a predetermined surface area in image data 60 or may be an occupied area made up of a predetermined number of pixels in image data 60. Which occupied area brightness change point group 65 adopts can be appropriately switched therebetween depending on the shape, color, and material of tape 80, and a part of tape 80 that falls within camera visual field Fc1.

In the present embodiment, brightness change point group 65 corresponds to at least a part of a characteristic section of tape 80. Specifically, as shown in FIGS. 4a, 4b, brightness change point group 65 corresponds to at least a part of a circumferential edge of feeding hole 85 which constitutes an apparent characteristic section of tape 80. When image processing section 52 extracts one or more brightness change point groups 65 in image data 60, image processing section 52 deduces position Ps of brightness change point group 65 in the image data. That is, image processing section 52 deduces a center position or a centroid position of brightness change point group 65 as position Ps of that brightness change point group 65 using, for example, a defined position of image data 60 as an origin.

There may be a case in which three or more image data 60 which are obtained by causing tape 80 to be imaged at multiple different timings during execution of one conveyance process are stored in storage device 51. In such a case, image processing section 52 extracts brightness change point group 65 for each of those three or more image data 60. Further, image processing section 52 deduces position Ps of brightness change point group 65 for each of those three or more image data 60.

Image processing section 52 does not calculate a degree of matching of shape or surface area for multiple brightness change point groups 65 which are extracted individually for multiple image data 60, or even when image processing section 52 does such a calculation, image processing section 52 may restrict the use of the degree of matching of shape or surface area so calculated only to reference for recognition of movement of brightness change point group 65. This is because a possibility that the apparent shape of the characteristic section of tape 80 changes as tape 80 moves relative to camera 13 or the light source should be taken into consideration.

Operation inspection device 50 includes calculating section 53 as shown in FIG. 1. Calculating section 53 calculates actual conveyance amount Nr of tape 80 which is actually conveyed as a result of the conveyance process based on positions Ps of brightness change point groups 65 which are deduced individually for multiple image data 60 by image processing section 52 (refer to FIG. 5). Actual conveyance amount Nr mentioned above corresponds to a moving distance in a conveyance direction of tape 80 when tape 80 is conveyed as a result of a conveyance process in which feeder 30 conveys tape 80 in the conveyance direction by expected designated conveyance amount Ns when the conveyance process is executed.

Figure 5:
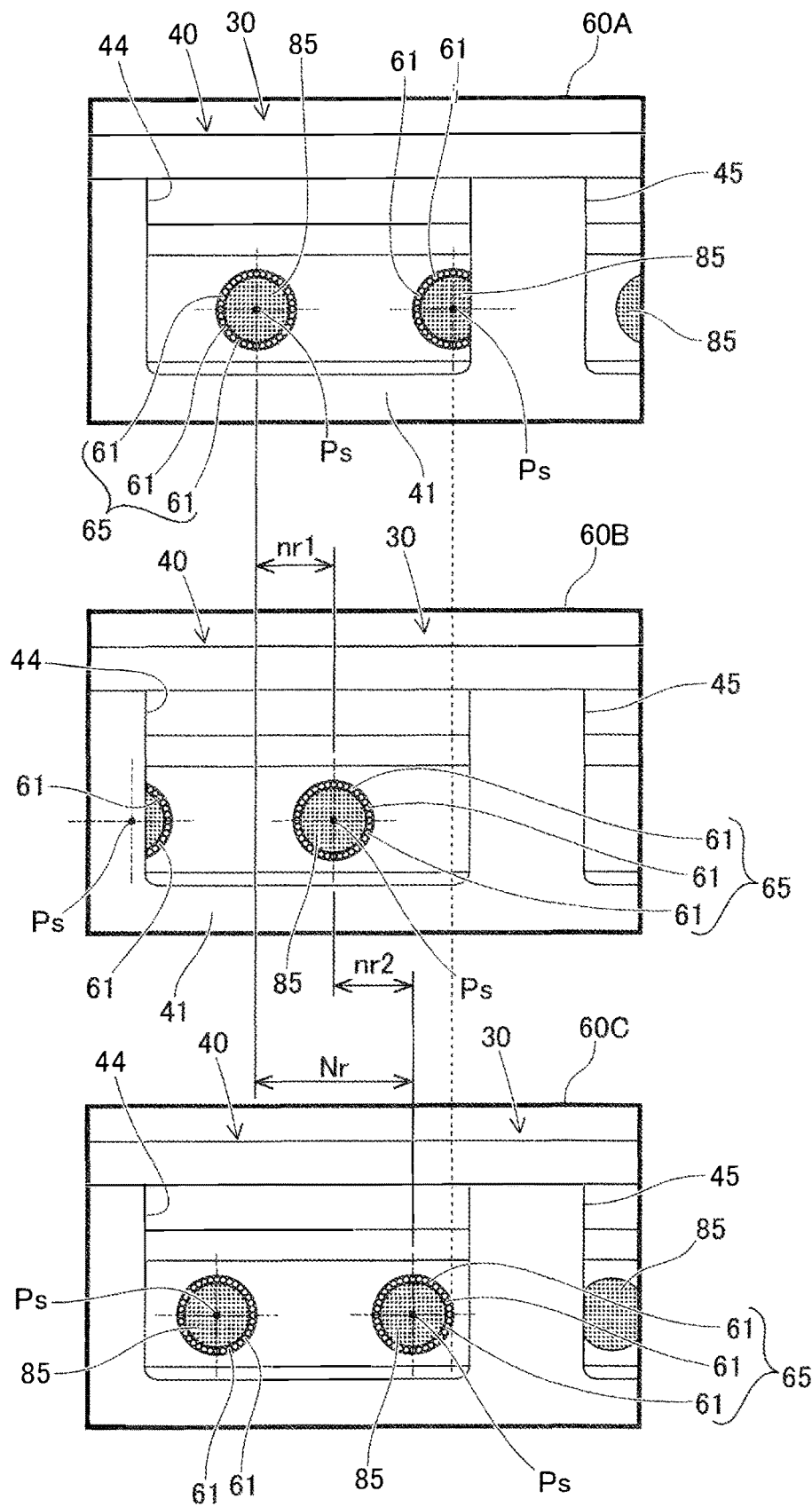
FIG. 5 is a diagram showing an actual conveyance amount which is calculated by executing image processing on three image data.

In addition, as shown in FIG. 5, calculating section 53 calculates partial actual conveyance amounts nr1, nr2 of tape 80 at imaging intervals corresponding to three or more image data 60A to 60C, the calculation being made based on position Ps of brightness change point group 65 of each of three or more image data 60, for example. Here, these three image data 60A to 60C are those which are obtained by imaging tape 80 at timings corresponding respectively to a starting timing when the conveyance process starts, an intermediate timing when tape 80 is conveyed on trial by a half of designated conveyance amount Ns, and an ending timing when the conveyance process ends.

As shown in FIG. 1, operation inspection device 50 includes determination section 54. Determination section 54 determines whether feeder 30 operates normally in the conveyance process based on designated conveyance amount Ns and actual conveyance amount Nr in the conveyance process. Specifically speaking, determination section 54 determines whether actual conveyance amount Nr of tape 80 falls within an allowable range which is something like a positioning error with respect to the designated conveyance amount Ns when feeder 30 conveys tape 80 on trial by designated conveyance amount Ns in the conveyance process.

If a difference between designated conveyance amount Ns and actual conveyance amount Nr is not within the allowable range, determination section 54 determines that feeder 30 is not operating normally. Even if actual conveyance amount Nr coincides with designated conveyance amount Ns (the difference is within the allowable range), there is an unapparent possibility that feeder 30 operates abnormally in reality; for example, partial movement distances of tape 80 are not constant over the whole of the execution period of the conveyance process or tape 80 moves in an opposite direction in reality.

Then, determination section 54 may determine whether feeder 30 operates normally based on partial designated conveyance amounts ns1, ns 2 of tape 80 by which tape 80 is conveyed at each of intervals of imaging carried out multiple times during execution of the conveyance process and partial actual conveyance amounts nr1, nr2 which are calculated by calculating section 53. As a result, determination section 54 can determine whether tape 80 is conveyed normally by partial designated conveyance amount ns1 in the conveyance direction, for example, at the intermediate timing in the conveyance process.

In the present embodiment, in the case that the difference between designated conveyance amount Ns and actual conveyance amount Nr in the conveyance process is out of the allowable range, determination section 54 determines that feeder 30 operates abnormally due to at least one of an engagement failure between sprocket 33 and feeding holes 85 and a rotational operation failure of sprocket 33. Additionally, determination section 54 may determine whether feeder 30 operates normally or identify a cause for an abnormal operation of feeder 30 based on the result of comparison of partial designated conveyance amounts ns1, ns2 with partial actual conveyance amounts nr1, nr2, respectively.

According to the configuration described above, an abnormal operation of feeder 30, which is now loaded with tape 80, can be detected. In addition, operation inspection device 50 of the present embodiment does not adopt a method of detecting, for example, the circular shape of feeding hole 85 of tape 80 but otherwise extracts brightness change point group 65 and deduces position Ps thereof in an image processing. As a result, even if, for example, the shape of feeding hole 85 is deformed, or the apparent shape thereof is changed due to a change in type of tape 80 or imaging environment, those deformation and change in apparent shape can be captured as brightness change point group 65, thereby making it possible to calculate actual conveyance amount Nr of tape 80.

Here, a calibration device is known which is used for setting a calibration value for use in a conveyance process by feeder 30. As the calibration device described above, there is, for example, a calibration device for feeder 30 loaded with a metallic master tape formed highly accurately in place of tape 80 as a target object in which a conveyance amount of the master tape is imaged by an exclusive camera to measure an actual conveyance amount. In the calibration device configured as described above, however, since the calibration device is provided to calculate a calibration value, a high image processing precision is required thereon, which increases the processing load. In addition, a constituent device needs to be managed strictly in terms of imaging environment or the like.

In contrast with this, with operation inspection device 50 described in the present embodiment, whether tape 80 is actually conveyed can be determined by the device configuration which is simpler than that of the calibration device mentioned above. Further, in the image processing, the change in type of tape 80 or imaging environment can be dealt with by deducing position Ps of brightness change point group 65. Furthermore, the processing load such as image processing can be mitigated.

5. Operation Inspection Process by Operation Inspection Device 50

Figure 6:
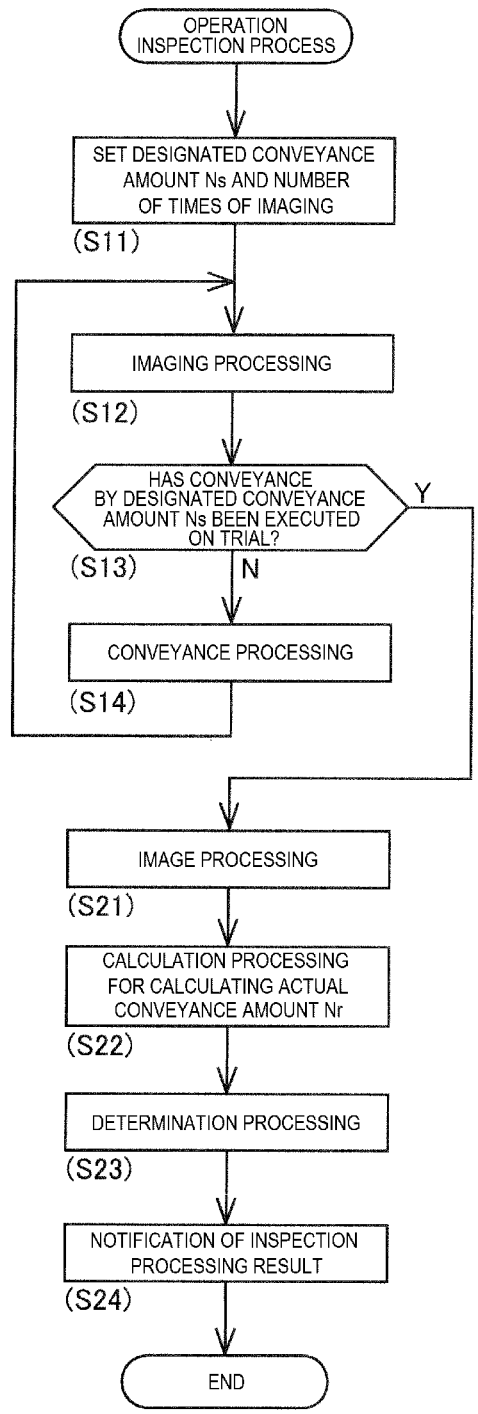
FIG. 6 is a flowchart illustrating an operation inspection process.

An operation inspection process of feeder 30 carried out by operation inspection device 50, which is configured as described above, will be described by reference to FIGS. 5 and 6. Operation inspection device 50 starts an operation inspection process after, for example, reels 71 are exchanged and tape 80 is installed in feeder 30 which is set in tape installation device 10. Operation inspection device 50 may obtain a type (shape, color, material, or the like) of tape 80 based on a component ID of a component installed in feeder 30 and set a condition for imaging by camera 13.

Firstly, operation inspection device 50 sets designated conveyance amount Ns of tape 80 by feeder 30 and the number of times of imaging in a conveyance process (S11). Here, designated conveyance amount Ns is set to an amount corresponding to a shorter interval than an interval defined between adjacent feeding holes 85 or an interval resulting from adding an integer multiple of the interval between these feeding holes to the shorter interval so that the positions of feeding holes 85 contained in image data 60 do not coincide at the starting timing, the intermediate timing, and the ending timing of the conveyance process. The number of times of imaging is a minimum of twice and three times in this case.

That is, operation inspection device 50 causes camera 13 to execute an imaging process three times in total which are timings corresponding to the starting timing of the conveyance process, the intermediate timing when tape 80 is conveyed on trial by a half of designated conveyance amount Ns (partial designated conveyance amount ns1), and the ending timing of the conveyance process. The intermediate timing of the conveyance process may be the timing when tape 80 is conveyed by a half of designated conveyance amount Ns as described above (ns1=ns2) or a timing when tape 80 is conveyed as far as a position deviating from the position where tape 80 is conveyed by a half of designated conveyance amount Ns as described above (ns 1≠ns 2).

As described above, operation inspection device 50 causes camera 13 to execute the imaging process at the starting timing of the conveyance process (S12). Subsequently, operation inspection device 50 determines whether tape 80 is conveyed on trial by designated conveyance amount Ns by feeder 30 (S13). Since a conveyance amount by which tape 80 is conveyed on trial is 0 at this starting timing (S13: No), operation inspection device 50 conveys tape 80 by partial designated conveyance amount ns1 (S14).

Operation inspection device 50 causes camera 13 to execute the imaging process again on tape 80, as an imaging target, which has been conveyed on trial by a half of designated conveyance amount Ns in S14 (S12). In this way, operation inspection device 50 repeats the imaging process by camera 13 (S12) and the conveyance process of tape 80 (S14) by a specified number of times. As a result, storage device 51 stores image data 60A-60C which are captured at the starting timing, the intermediate timing, and the ending timing of the conveyance process.

Subsequently, image processing section 52 image processes multiple image data 60A to 60C which are obtained through the image processing (S12) executed multiple times (S21). Specifically speaking, image processing section 52 deduces position Ps of brightness change point group 65 for each of multiple image data 60A to 60C. Here, image processing section 52 knows that an area which can be brightness change point group 65 in image data 60A is an occupied area having a predetermined surface area which corresponds to feeding hole 85 of tape 80 and knows roughly a position where feeding hole 85 is located in image data 60A

Image processing section 52 executes an image processing, for example, the type of tape 80, extracts brightness change point group 65 corresponding to feeding hole 85 which constitutes an apparent characteristic section of tape 80, and deduces position Ps of that brightness change point group 65. In addition, in image processings from a second time on, image processing section 52 may be made to extract brightness change point group 65 and deduce position Ps from the respective corresponding areas based on conveyance information on how much feeding hole 85 is conveyed in an expected conveyance direction so as to increase the image processing efficiency.

Thereafter, calculating section 53 executes a calculation processing of actual conveyance amount Nr of tape 80 which is actually conveyed through the conveyance process (S22). Specifically speaking, calculating section 53 calculates actual conveyance amount Nr of tape 80 based on position Ps of brightness change point group 65 deduced for each of multiple image data 60A and 60C through the image processing (S21). Further, calculating section 53 calculates individually actual conveyance amounts nr1, nr2 of tape 80 based on brightness change point group 65 of image data 60B.

Subsequently, determination section 54 executes a determination processing for determining whether feeder 30 operates normally (S23). Specifically speaking, in the case that the difference between designated conveyance amount Ns and actual conveyance amount Nr is out of the allowable range, determination section 54 determines that feeder 30 operates abnormally. Further, determination section 54 determines from multiple points of view whether feeder 30 operates normally based on partial designated conveyance amounts ns1, ns2 and partial actual conveyance amounts nr1, nr2 which are calculated by calculating section 53. If nothing abnormal is determined in both the determinations, determination section 54 determines that feeder 30 operates normally.

Finally, operation inspection device 50 notifies the operator or the like of the result of the inspection process (S24). Specifically speaking, operation inspection device 50 may notify the operator or the like of a degree at which designated conveyance amount Ns coincides with actual conveyance amount Nr together with the results of the determination on whether feeder 30 operates normally. In addition, in the case that feeder 30 operates abnormally, operation inspection device 50 may also notify additionally of a cause for the abnormal operation such as an installation failure of tape 80, a failure occurring possibly in the drive system or the control system, or the like.

6. Modified Aspect of Embodiment 6-1. Application of Operation Inspection Device 50 to Component Mounter 20

In the embodiment, operation inspection device 50 for feeder 30 is described as being applied to tape installation device 10. In contrast with this, operation inspection device 50 may be configured so as to be applied to component mounter 20 for mounting a component on board 90.

Figure 7:
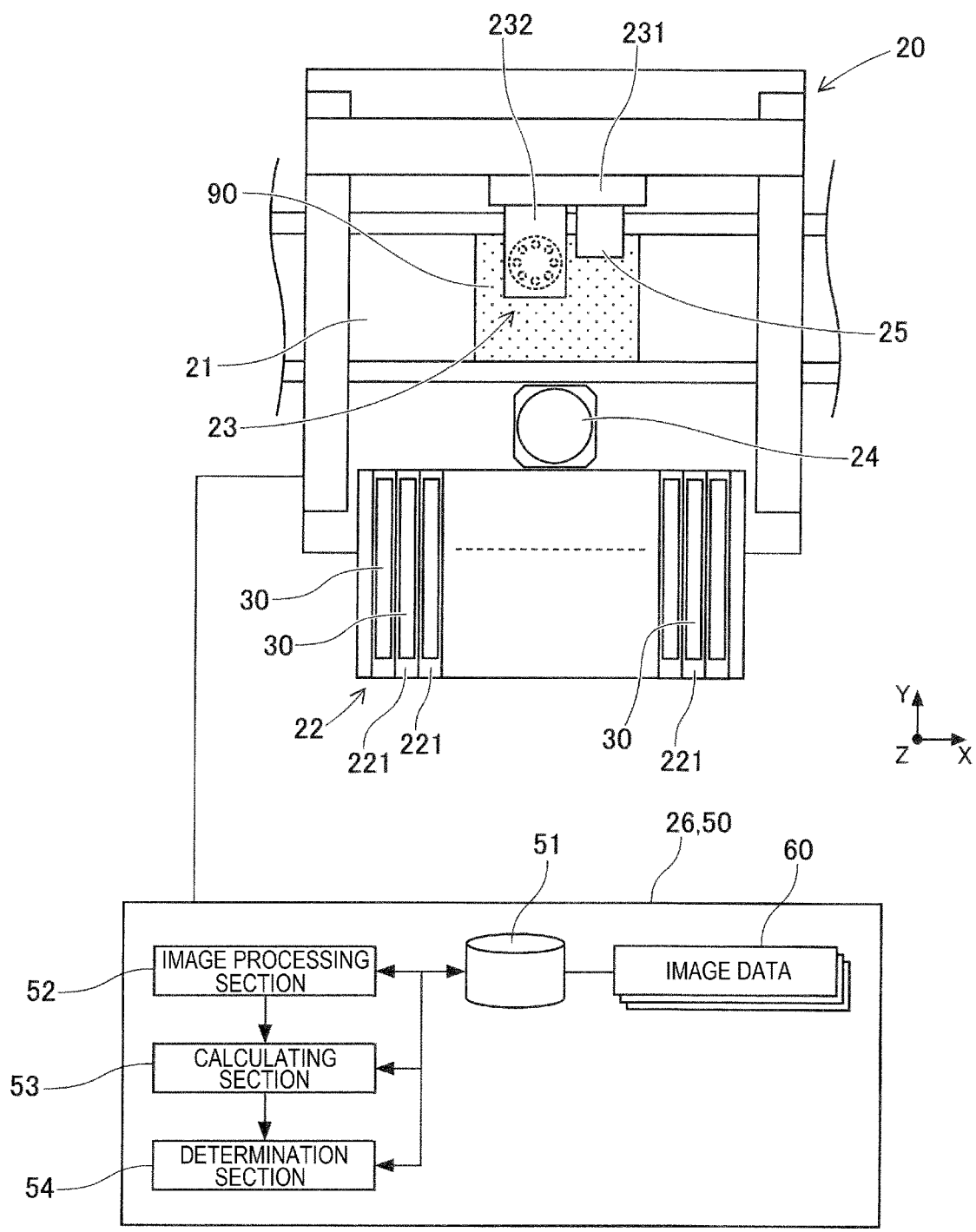
FIG. 7 is a schematic diagram showing the configurations of a component mounter and an operation inspection device according to a modified aspect of the embodiment.

Component mounter 20 includes, as shown in FIG. 7, board conveyance device 21, component supply device 22, component transfer device 23, part camera 24, board camera 25, and control device 26. Board conveyance device 21 conveys sequentially board 90 in a conveyance direction and positions board 90 in a predetermined position inside component mounter 20. Component supply device 22 supplies a component that is to be mounted on substrate 90. In component supply device 22, feeders 30 are individually set in multiple slots 221.

Component transfer device 23 transfers the component supplied by component supply device 22 to a predetermined mounting position on board 90. Component transfer device 23 includes moving table 231 and mounting head 232. Moving table 231 is moved in a horizontal direction (an X-direction and a Y-direction) by a linear motion mechanism. Mounting head 232 is fixed to moving table 231 in an exchangeable fashion by a clamp member, not shown.

Mounting head 232 supports one or more holding members in such a manner as to allow them not only to be rotated but also to be lifted up and lowered. As a result of being configured as described above, mounting head 232 picks up a component supplied by feeder 30 and mounts the component so picked up on board 90. A suction nozzle configured to pick up a component using negative pressure air or a chuck configured to hold a component can be adopted as the holding member mentioned above.

Part camera 24 and board camera 25 are a digital imaging device having an imaging element such as CMOS or the like. Part camera 24 and board camera 25 execute imaging based on a control signal and transmit image data captured through the imaging. Part camera 24 is configured so as to image a component held by the holding member of mounting head 232 from below. Board camera 25 is provided on moving table 231 in such a manner as to move in a horizontal direction together with mounting head 232. Board camera 25 is configured so as to image board 90 from above.

Control device 26 is made up mainly of CPU, various types of memories, and a control circuit. Control device 26 controls a mounting process for mounting a component on board 90. Various data including a control program used for controlling the mounting process and the like are stored in control device 26. The mounting process includes a process for repeating multiple times a pick-and-place cycle (hereinafter, referred to as a "PP cycle") in which a component supplied by component supply device 22 is picked up by mounting head 232 and the component so picked up is mounted in a predetermined mounting position on board 90.

In the mounting process, control device 26 controls the operation of component transfer device 23 based on information outputted from various types of sensors, the result of an image processing, the control program, and the like. As a result, the positions and angles of the multiple holding members supported by mounting head 232 are controlled. In the PP cycle, control device 26 causes part camera 24 to image a component held by the holding member and recognizes a holding state of the component using image data obtained through the imaging.

Further, control device 26 causes board camera 25 to image board 90 which is conveyed into component mounter 20 by board conveyance device 21 and recognizes a positioning state of board 90 using image data captured through the imaging. Then, operation inspection device 50 is incorporated in, for example, control device 26 of component mounter 20 and executes an operation inspection on feeder 30 as an inspection target at an appropriate timing. For example, a timing when feeder 30 is set in slot 221, a timing when component mounter 20 is charged with a power supply, a timing when mounting head 232 fails to pick up a component, and the like are considered as the timing when the operation inspection is carried out.

In the configuration described above, multiple image data 60, which are used for the operation inspection process, are obtained through imaging by board camera 25 which is moved so as to image tape 80 installed in feeder 30 for supplying components. That is, board camera 25 provided on moving table 231 has a movable range which enables board camera 25 to capture feeder 30 within a camera visual field and is shared for an imaging process of tape 80 during execution of the conveyance process by feeder 30.

With such a configuration, component mounter 20 executes an operation inspection process for inspecting the operation of feeder 30 at a timing when a pickup error of a component by mounting head 232 is detected or the like, for example, in the midst of execution of the mounting process. Specifically speaking, in the case that an abnormal operation of feeder 30 is considered as a cause for generating the pickup error described above, operation inspection device 50 causes board camera 25 to be moved as far as a position lying above feeder 30 in question. Then, operation inspection device 50 causes feeder 30 to execute a conveyance process of tape 80 and obtains multiple image data 60 through an imaging process which is repeated multiple times by board camera 25.

As with the embodiment, operation inspection device 50 determines whether feeder 30 operates normally by use of multiple image data 60 so obtained. Control device 26 obtains an inspection result from operation inspection device 50, and in the case that an abnormal operation of feeder 30 is detected, control device 26 can notify, for example, the operator to that effect or can switch the supply of a component from one by malfunctioning feeder 30 to another by separate compatible feeder 30 to thereby resume the mounting process.

In addition, in the case that no abnormal operation is detected in feeder 30, control device 26 may notify, for example, the operator of a possibility that a cause for the pickup error resides in mounting head 232 or the holding member, or of a need for maintenance of these pieces of equipment. With such a configuration, an abnormal operation of feeder 30 or the like can be detected at an early timing, thereby making it possible to suppress a decrease in the production efficiency at component mounter 20.

6-2. Camera 13 and Image Data 60

In the embodiment, camera 13 is set to camera visual field Fc1 so that a part of tape 80 can be imaged through, for example, opening portion 44 in tape guide 40, as shown in FIG. 3. In contrast with this, in camera 13 or board camera 25, its camera visual field may be set in a position other than camera visual field Fc1 described above as long as camera 13 or board camera 25 can image tape 80 installed in feeder 30.

Specifically speaking, in camera 13 and board camera 25, camera visual field Fc2 may be set which enables tape 80 to be imaged through supply section 32 of feeder 30 as shown, for example, in FIG. 3 when imaging tape 80 during execution of the conveyance process. Cavity 86, which constitutes an apparent characteristic section of tape 80, is contained in image data 60 which are obtained through the imaging process configured as described above.

Then, in the image processing, image processing section 52 extracts brightness change point group 65, which corresponds to at least a part of a circumference of cavity 86, for each of multiple image data 60. Further, image processing section 52 deduces position Ps of that brightness change point group 65 so extracted for each of multiple image data 60. With such a configuration, the same advantage as that of the embodiment can be provided.

In addition, camera 13 and board camera 25 may image a portion of tape 80 other than feeding hole 85 and cavity 86 as a characteristic section of tape 80 in the imaging process. For example, in the case that a mark is affixed to tape 80 or a flaw happens to be caused on an upper surface of tape 80, these may be imaged as a characteristic section of tape 80. In addition, image processing section 52 may be configured to extract these characteristic sections and feeding hole 85 or cavity 86 as brightness change point groups 65 which correspond to each other in a combined fashion and to deduce positions Ps of those brightness change point groups 65.

6-3. Others

In the embodiment and the modified aspect, operation inspection device 50 is described as being applied to tape installation device 10 or component mounter 20. In contrast with these examples, operation inspection device 50 may be an external device which is different from tape installation device 10 or component mounter 20. In this case, operation inspection device 50 may be an exclusive device which mainly has a function of executing an operation inspection processing or may be configured to be applied to a pallet for use for an external setup of feeder 30. With either of the configurations, the same advantage as that of the embodiment can be provided.

REFERENCE SIGNS LIST

10: tape installation device, 13: camera, 20: component mounter, 22: component supply device, 23: component transfer device, 232: mounting head, 25: board camera, 30: feeder, 31: main body section, 32: supply section, 33: sprocket, 34: motor, 35: feeder control section, 40: tape guide, 50: operation inspection device, 51: storage device, 52: image processing section, 53: calculating section, 54: determination section, 60, 60A-60C: image data, 61: brightness change point, 65: brightness change point group (occupied area), 80: carrier tape, 85: feeding hole (characteristic section), 86: cavity (characteristic section), 90: board, Fc1, Fc2: camera visual field, Ns: designated conveyance amount, ns1, ns2: partial designated conveyance amount, Nr: actual conveyance amount, nr1, ne2: partial actual conveyance amount, Ps: position (of brightness change point group)

The invention claimed is:

1. A feeder operation inspection device for a feeder for conveying a carrier tape,
the feeder executing a conveyance process for conveying the carrier tape by a designated conveyance amount, the feeder operation inspection device comprising:
a storage device configured to store multiple image data obtained by causing the carrier tape to be imaged by a camera at multiple different timings during execution of the conveyance process;
an image processing section configured to deduce a position of a brightness change point group, which is a set of brightness change points where an amount of change in brightness relative to a periphery in the image data is equal to or larger than a specified value, for each of the multiple image data;
a calculating section configured to calculate an actual conveyance amount of the carrier tape which is actually conveyed through the conveyance process based on the position of the brightness change point group of each of the multiple image data; and
a determination section configured to determine whether the feeder operates normally in the conveyance process based on the designated conveyance amount and the actual conveyance amount in the conveyance process.

2. The feeder operation inspection device according to claim 1,
wherein the brightness change point group is an occupied area of a predetermined surface area in the image data or an occupied area comprising a predetermined number of pixels in the image data.

3. The feeder operation inspection device according to claim 1,
wherein the brightness change point group corresponds to at least a part of a characteristic section of the carrier tape.

4. The feeder operation inspection device according to claim 3,
wherein the characteristic section of the carrier tape is at least either of feeding holes and component accommodating cavities which are both formed in the carrier tape at equal intervals in a conveyance direction of the carrier tape.

5. The feeder operation inspection device according to claim 1,
wherein the storage device stores the image data of three or more which are obtained through multiple times of imaging during execution of the conveyance process,
wherein the image processing section deduces a position of the brightness change point group for each of the image data of three or more, and
wherein the calculating section calculates a partial actual conveyance amount of the carrier tape at an imaging interval defined between any two image data of the image data of three or more based on the position of the brightness change point group deduced for each of the image data of three or more.

6. The feeder operation inspection device according to claim 5,
wherein the determination section determines whether the feeder operates normally based on a partial designated conveyance amount of the carrier tape at each of intervals defined over multiple times of imaging during execution of the conveyance process and the partial actual conveyance amount calculated by the calculating section.

7. The feeder operation inspection device according to claim 1,
wherein the feeder comprises:
a main body section; and
a sprocket provided rotatably on the main body section and configured to be brought into engagement with feeding holes formed in the carrier tape at equal intervals in a conveyance direction of the carrier tape,
wherein when a difference between the designated conveyance amount and the actual conveyance amount in the conveyance process is out of an allowable range, the determination section determines that the feeder operates abnormally due to at least either of an engagement failure between the sprocket and the feeding holes and a rotational operation failure of the sprocket.

8. The feeder operation inspection device according to claim 1,
the feeder operation inspection device being applied to a tape installation device for assisting in installing or automatically installs the carrier tape in the feeder,
wherein the multiple image data are obtained by imaging the carrier tape by the camera provided on the tape installation device exclusively to image the carrier tape installed in the feeder.

9. The feeder operation inspection device according to claim 1,
the feeder operation inspection device being applied to a component mounter for mounting a component on a board,
wherein the component mounter comprises:
a mounting head configured to pick up the component supplied by the feeder and mount the component so picked up on the board; and
a board camera provided so as to move together with the mounting head and configured to image the board, and
wherein the multiple image data are obtained through imaging by the board camera which is moved so as to image the carrier tape which is installed in the feeder for supplying the component.

* * * * *